US006847090B2

(12) United States Patent
Loeppert

(10) Patent No.: US 6,847,090 B2
(45) Date of Patent: Jan. 25, 2005

(54) SILICON CAPACITIVE MICROPHONE

(75) Inventor: Peter V. Loeppert, Hoffman Estates, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 10/041,440

(22) Filed: Jan. 8, 2002

(65) Prior Publication Data

US 2002/0106828 A1 Aug. 8, 2002

Related U.S. Application Data

(60) Provisional application No. 60/263,785, filed on Jan. 24, 2001.

(51) Int. Cl.[7] ................................................ H01L 29/82

(52) U.S. Cl. ......................................... 257/418; 438/53

(58) Field of Search ................................ 257/416, 417, 257/418, 419; 438/52, 53

(56) References Cited

U.S. PATENT DOCUMENTS

| | | | | | |
|---|---|---|---|---|---|
| 4,825,335 | A | | 4/1989 | Wilner | 361/283 |
| 4,910,840 | A | | 3/1990 | Sprenkels et al. | 29/25.41 |
| 5,146,435 | A | | 9/1992 | Bernstein | 367/181 |
| 5,178,015 | A | | 1/1993 | Loeppert et al. | 73/718 |
| 5,408,731 | A | | 4/1995 | Berggvist et al. | 29/25.41 |
| 5,452,268 | A | * | 9/1995 | Bernstein | 367/181 |
| 5,490,220 | A | | 2/1996 | Loeppert | 381/168 |
| 5,677,965 | A | * | 10/1997 | Moret et al. | 381/191 |
| 5,870,482 | A | | 2/1999 | Loeppert et al. | 381/174 |
| 6,012,335 | A | | 1/2000 | Bashir et al. | 73/724 |

FOREIGN PATENT DOCUMENTS

| | | |
|---|---|---|
| EP | 0 549 200 A1 | 6/1993 |
| JP | 55001737 | 1/1980 |
| JP | 03001515 | 1/1991 |
| WO | WO-85/00495 A1 | 1/1985 |

OTHER PUBLICATIONS

European Search Report for Application No. 02250467.4 dated Oct. 1, 2003.

* cited by examiner

*Primary Examiner*—David Nelms
*Assistant Examiner*—Quoc Hoang
(74) *Attorney, Agent, or Firm*—Marshall, Gerstein & Borun LLP

(57) ABSTRACT

The present invention is directed to a process for the manufacture of a plurality of integrated capacitive transducers. The process comprises the steps of supplying a first substrate of a semiconductor material having first and second faces, supplying a second substrate of a semiconductor material having first and second faces, forming a diaphragm layer on the first face of the first substrate, forming a backplate layer on the first face of the other of the second substrate, forming a support layer on the backplate layer, etching a plurality of supports from the support layer, for each of the capacitive transducers, etching a plurality of vents from the backplate layer, for each of the capacitive transducers, positioning the diaphragm layer of the first substrate adjacent with the support layer of the second substrate, and welding the diaphragm layer and the support layer together, removing at least a portion of the first substrate to expose the diaphragm layer, for each of the capacitive transducers, removing a portion of the second substrate to expose the vents, for each of the capacitive transducers, and, etching a portion of the diaphragm layer, for each of the capacitive transducers.

29 Claims, 2 Drawing Sheets

3A
3B
3C
3D
3E
3F
3G

SILICON CAPACITIVE MICROPHONE

CROSS-REFERENCE TO RELATED APPLICATIONS

This is the Utility Patent Application claims benefit of Provisional Patent Application Ser. No. 60/263,785, filed Jan. 24, 2001.

TECHNICAL FIELD

The present invention relates to a process for manufacturing a silicon based capacitive transducer, such as a microphone. Specifically, the present invention is directed to improving at least issues of size, cost, diaphragm compliance, stray capacitance, and low frequency response control of capacitive transducers.

BACKGROUND OF THE INVENTION

Conventional electret condenser microphones (ECMs) are widely available and used in significant volumes in numerous consumer products including toys, hearing aids, and cell phones. Replacing the traditional ECM with batch processed silicon microphones is based on meeting or exceeding the performance and cost of the ECM in high volume. The cost of a silicon microphone is proportional to the product of its complexity, i.e. number of mask steps, and its size. In order to scale down a microphone to very small size, a number of different design and process issues must be mastered.

U.S. Pat. No. 5,408,731 to Berggvist et al. shows one way of making a silicon microphone. Berggvist et al. discloses a single crystal silicon diaphragm rigidly supported at its edges by a silicon frame etched from the handle wafer. The minimum size of this device is based on the diaphragm size needed to achieve the desired sensitivity plus the amount of frame area needed to properly support the diaphragm. Fully clamped diaphragms are very stiff for their size. In addition, the process requires forming a connecting layer, and after etching the first substrate to form the diaphragm, the process requires the step of eliminating a part of the connecting layer which is located between the diaphragm and the part of the second substrate to form an open space between the diaphragm and the second substrate. The present invention alleviates the need for forming a connecting layer and eliminating a part of this connecting layer which is located between the diaphragm and the part of the second substrate to form an open space between the diaphragm and the second substrate, as will become apparent from the description below.

U.S. Pat. No. 5,490,220 to Loeppert discloses that simply supported diaphragms are more compliant and can be made smaller to achieve the same performance.

The capacitance between the flexible diaphragm and the rigid backplate of a capacitive microphone can be divided into two portions. The first portion varies with acoustic signal and is desirable. The second portion, or parasitic capacitance portion, does not vary with acoustic signal. The second portion is related to the construction of the microphone and is undesirable as it degrades performance. This parasitic capacitance portion should be minimized. Berggvist et al. attaches the two electrodes together at the end of the arms (26). Although the area is small, the parasitic capacitance is relatively large.

It is the object of the present invention to overcome the disadvantages of the prior art by at least achieving a high sensitivity with a small diaphragm, reducing the die size, and reducing the parasitic capacitance. Other features and advantages will be apparent to those skilled in the art with reference to the below description and the Figures.

SUMMARY OF THE INVENTION

It is an object of the present invention to provide a process for the manufacture of a plurality of integrated capacitive transducers. In accordance with the present invention, the process comprises the steps of supplying a first substrate of a semiconductor material having first and second faces, supplying a second substrate of a semiconductor material having first and second faces, forming a diaphragm layer on the first face of the first substrate, forming a backplate layer on the first face of the other of the second substrate, forming a support layer on the backplate layer, etching a plurality of supports from the support layer, for each of the capacitive transducers, etching a plurality of vents from the backplate layer, for each of the capacitive transducers, positioning the diaphragm layer of the first substrate adjacent with the support layer of the second substrate, and welding the diaphragm layer and the support layer together, removing at least a portion of the first substrate to expose the diaphragm layer, for each of the capacitive transducers, removing a portion of the second substrate to expose the vents, for each of the capacitive transducers, and, etching a portion of the diaphragm layer, for each of the capacitive transducers.

It is contemplated that the process comprises the step of forming an electrical contact with each of the first and second substrates, and the step of the forming the contacts comprises metalization by vacuum evaporation or sputtering.

It is further contemplated that the step of etching the plurality of supports from the support layer takes place before the step of positioning the diaphragm layer of the first substrate adjacent with the support layer of the second substrate, and welding the diaphragm layer and the support layer together.

It is also contemplated that the step of etching a plurality of vents from the backplate layer takes place before the step of positioning the diaphragm layer of the first substrate adjacent with the support layer of the second substrate, and welding the diaphragm layer and the support layer together.

It is also contemplated that the portion of the second substrate under the plurality of supports is electrically isolated from the portion of the second substrate under the diaphragm interior to the supports.

It is even further contemplated that the step of etching the portion of the diaphragm layer comprises etching the portion of the diaphragm layer at a position that is laterally exterior to where the supports are or will be located for forming the diaphragm.

It is also contemplated that the step of removing the portion of the second substrate to expose the vents comprises creating at least a partially angled second substrate wall, and that the at least partially angled wall has an uppermost region defining a boundary, wherein the boundary is at least partially located interior to the location of at least one support.

It is further contemplated that at least one of the steps creates a barometric relief path, wherein the barometric relief path proceeds around the edge of the formed diaphragm, under the formed diaphragm, and down through a back hole. As such, the diaphragm overlaps with of the backplate. The overlap creates a long contorted path that establishes a sufficiently high resistance for a low frequency response.

Other features and advantages of the invention will be apparent from the following specification taken in conjunction with the following drawings.

DETAILED DESCRIPTION

Figure 1:
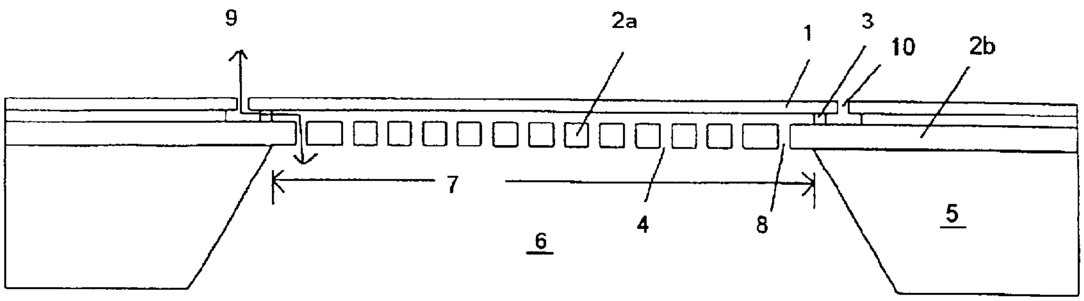
FIG. 1 is a cross-sectional view of the microphone assembly of the present invention, along where a post or support is located.
Figure 2:
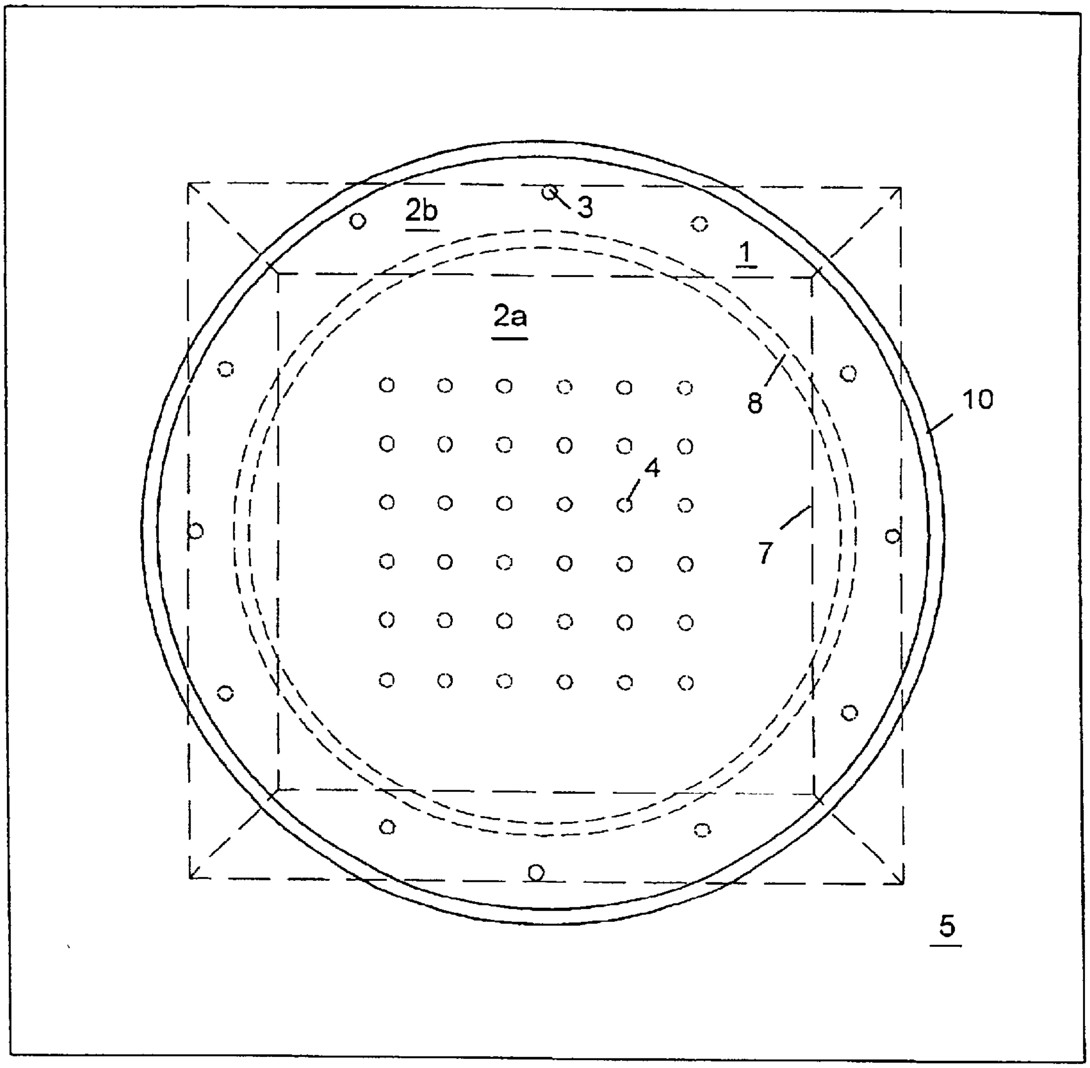
FIG. 2 is a plan view of the microphone assembly of the present invention.

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

A capacitive microphone is shown in FIG. 1, and comprises a flexible diaphragm 1 supported in close proximity to a rigid backplate 3. The diaphragm 1 of the present invention is supported at its edge by a small number of very small posts or supports 3. The supports 3 allow most, if not all, of the edge of the diaphragm 1 to rotate or flex as acoustic pressure is applied. The rotation or flex of the diaphragm 1 at the edge of the diaphragm 1 lowers the stiffness of the diaphragm 1 when compared to a fully constrained or clamped diaphragm. The posts or supports 3 are connected to a backplate 2. An etched cavity 6 intersects the backplate 2 at a boundary 7 of a cavity 6, and this boundary 7 is within the perimeter of the diaphragm 1. A die or wafer 5 is provided, and is attached to the backplate 2. The size of the die 5 is reduced based on the simple support arrangement of the diaphragm 1. Thus, the diaphragm 1 can be smaller and the size or width of the cavity 6 at the boundary 7 can be smaller than the width of the diaphragm 1.

The backplate 2 is formed as a P+-type epitaxial layer on an N-type die or wafer 5. In order to minimize parasitic capacitance, a second backplate region 2*b*, where the supports 3 are placed, is separated from a first backplate region 2*a* under the active area in the central portion of the diaphragm 1. The first and second backplate regions 2*a*, 2*b* are separated by a trench 8 etched through the epitaxial layer.

A barometric relief is necessary for proper microphone operation. The resistance in conjunction with the back volume capacity of the microphone determines the lower limit of the acoustic frequency response. In FIG. 1, one embodiment creates this barometric relief by defining by a path 9 around the edge of the diaphragm 1, under the diaphragm 1, and down through a back hole as shown by the location of element 8 in FIG. 1. The overlap of the diaphragm 1 and the backplate 2 creates a long contorted path that establishes a sufficiently high resistance for a low frequency response. Bonding pads (not shown) or other means can be provided to electrically connect to the diaphragm 1 and the backplate regions 2*a*, 2*b*.

Figure 3:
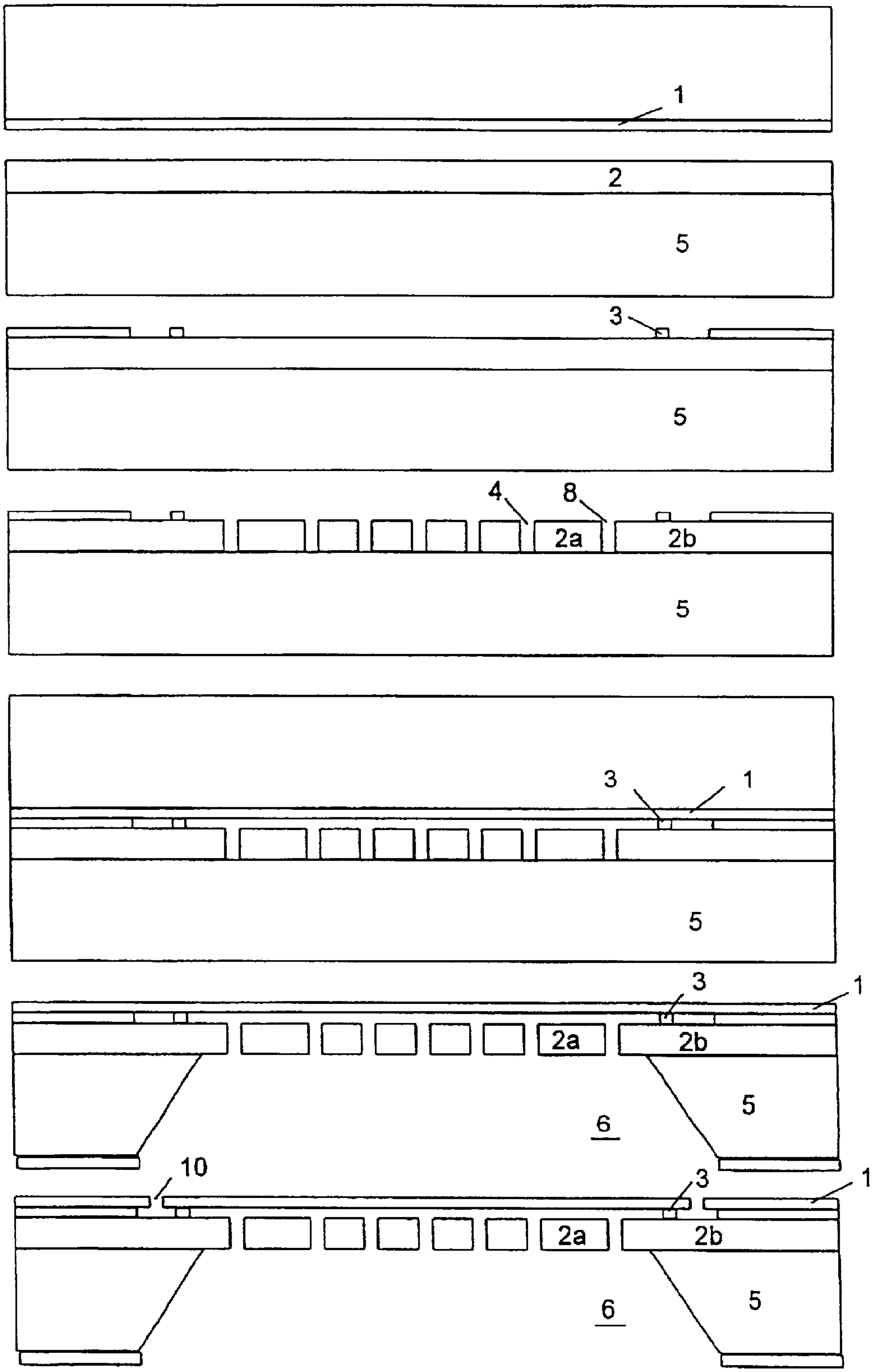
FIGS. 3A to 3G are cross-sectional views of the microphone assembly at various stages of the manufacturing process, along where a post or support is located, as will be described in more detail below.

FIG. 3 shows a process sequence of the manufacturing process of one embodiment of the present invention. FIG. 3A shows the diaphragm 1 wafer with its thin epitaxial layer that will become the final diaphragm 1. FIG. 3B shows the backplate 2 wafer with its relatively thicker epitaxial layer. As mentioned earlier, this epitaxial layer is typically P+-type while the base wafer is N-type. FIG. 3C shows the formation of the supports 3, which are shown as posts 3 within the embodiment defined by FIGS. 3A–3G. This support 3 layer is typically an oxide layer that has been thermally grown or deposited on the wafer and etched to form the supports 3. Creation of the supports 3 before the diaphragm 1 is created, and/or before the layer which will later be the diaphragm 1 is attached as a part of a separate substrate, is in significant contrast to the Berggvist et al. patent.

FIG. 3D shows the vent holes 4 that have been etched in an area that will become the first backplate region 2*a* and the trench 8 which separates the first and second backplate regions 2*a*, 2*b*. The two backplate regions can be electrically isolated so that a guard signal can be applied to the second backplate region 2*b*, further reducing the parasitic capacitance. The first and second wafers have been bonded in FIG. 3E. This bond can be accomplished by any of several ways known in the industry. However, the preferred method is by silicon fusion bonding. The backside of the backplate wafer 5 is masked and an anisotropic etchant is used to form the cavity 6 in FIG. 3F. The diaphragm wafer is thinned during the etch to leave just the epitaxial diaphragm layer 1. The diaphragm epitaxial layer may be P+ so as to act as an etch stop or the layer may be formed using an SOI (silicon on insulator) process. Stress compensating dopants can be added to the P+ layer to maximize the diaphragm 1 compliance. FIG. 3G shows the etching of the trench 10 at the edge of the diaphragm 1.

Alternate manufacturing processes are also anticipated. For instance the backplate epitaxial layer may be formed on an SOI wafer. Further, the diaphragm 1 thinning may be a separate step. The diaphragm 1 may be lightly doped to minimize stress, and an electrochemical etch stop process can be used to thin the wafer.

While the specific embodiment has been illustrated and described, numerous modifications come to mind without significantly departing from the spirit of the invention and the scope of protection is only limited by the scope of the accompanying Claims.

What is claimed is:

1. An integrated capacitive transducer comprising:

a diaphragm having an edge;

a remaining diaphragm layer laterally spaced from the diaphragm forming a passage in proximity to the edge of the diaphragm;

a backplate spaced in proximity to the diaphragm; and, a plurality of supports connected to the backplate, for supporting the diaphragm.

2. The transducer of claim 1 wherein the backplate comprises a first region and a second region in proximity to each other, wherein the first and second regions form a relief.

3. The transducer of claim 2 wherein the supports are only connected to the second region of the backplate.

4. The transducer of claim 2 wherein a portion of each of the first and second regions are connected to and supported by a die.

5. The transducer of claim 4 wherein the relief is a hole.

6. The transducer of claim 4 wherein the relief is a trench.

7. The transducer of claim 1 wherein the backplate has a plurality of holes.

8. The transducer of claim 1 further comprising:

a die connected to the backplate forming a cavity.

9. The transducer of claim 8 wherein an angled edge of the die forms the cavity.

10. The transducer of claim 8 wherein at least a portion of a die width of the die is narrower than a diaphragm width of the diaphragm.

11. The transducer of claim 8 wherein the backplate is a P+-type semiconductor, and wherein the die is an N-type semiconductor.

12. The transducer of claim 8 wherein the die has an angled wall having an uppermost region defining a boundary, wherein the boundary is at least partially located interiorly to the location of at least one support.

13. The transducer of claim 8 further comprising a protecting layer connected to the die.

14. The transducer of claim 1, wherein the diaphragm is flexible.

15. The transducer of claim 1, wherein the supports allow at least a portion of the edge of the diaphragm to flex as acoustic pressure is applied to the diaphragm.

16. An integrated capacitive transducer comprising:

a diaphragm having a diaphragm surface and an edge defined by the surface;

a backplate having a backplate surface; and a plurality of supports connected to the backplate surface and the diaphragm surface inwardly from the edge, the supports extending between the backplate surface and the diaphragm surface for supporting the diaphragm and backplate in spaced relationship to each other.

17. The transducer of claim 16 wherein the backplate comprises a first region and a second region in proximity to each other, wherein the first and second regions form a relief.

18. The transducer of claim 17 wherein the supports are only connected to the second region of the backplate.

19. The transducer of claim 17 wherein a portion of each of the first and second regions are connected to and supported by a die.

20. The transducer of claim 16 wherein the backplate has a plurality of holes.

21. The transducer of claim 16 further comprising:

a die connected to the backplate forming a cavity.

22. The transducer of claim 21 wherein an angled edge of the die forms the cavity.

23. The transducer of claim 21 wherein at least a portion of a die width of the die is narrower than a diaphragm width of the diaphragm.

24. The transducer of claim 21 wherein the backplate is a P+-type semiconductor, and wherein the die is an N-type semiconductor.

25. The transducer of claim 21 further comprising a protecting layer connected to the die.

26. The transducer of claim 16, wherein the diaphragm is flexible.

27. The transducer of claim 16, wherein the supports allow substantially the entire edge of the diaphragm to flex as acoustic pressure is applied to the diaphragm.

28. An integrated capacitive transducer comprising:

a diaphragm;

a backplate;

means connected to each of the diaphragm and the backplate for supporting the diaphragm and backplate in spaced relationship; and means for reducing parasitic capacitance.

29. The integrated capacitive transducer of claim 28, further comprising means for providing a barometric relief path.

* * * * *